(12) United States Patent
Kawano

(10) Patent No.: US 7,589,394 B2
(45) Date of Patent: Sep. 15, 2009

(54) INTERPOSER

(75) Inventor: Shuichi Kawano, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 35 days.

(21) Appl. No.: 11/969,606

(22) Filed: Jan. 4, 2008

(65) Prior Publication Data

US 2008/0253097 A1    Oct. 16, 2008

Related U.S. Application Data

(60) Provisional application No. 60/910,970, filed on Apr. 10, 2007.

(51) Int. Cl.
  *H01L 29/00*   (2006.01)
  *H01L 23/52*   (2006.01)
  *H01L 23/48*   (2006.01)
  *H01L 29/40*   (2006.01)
  *H01L 27/08*   (2006.01)
  *H05K 1/18*    (2006.01)

(52) U.S. Cl. ............... 257/532; 257/535; 257/774; 257/E27.048; 361/763

(58) Field of Classification Search .......... 257/532, 257/535, 774, E27.048; 361/763
See application file for complete search history.

(56) References Cited

U.S. PATENT DOCUMENTS 6,724,638 B1 *  4/2004  Inagaki et al. ............ 361/763
6,882,544 B2 *  4/2005  Nakamura et al. ......... 361/765
6,910,266 B2 *  6/2005  Lee et al. .................... 29/832
7,233,061 B1 *  6/2007  Conn ......................... 257/686
2008/0017407 A1  1/2008  Kawano

FOREIGN PATENT DOCUMENTS

| JP | 2001-326305 | 11/2001 |
|----|-------------|---------|
| JP | 2001-352017 | 12/2001 |
| JP | 2005-203680 | 7/2005  |
| JP | 2006-253631 | 9/2006  |
| JP | 2006-278553 | 10/2006 |

OTHER PUBLICATIONS

U.S. Appl. No. 11/860,132, filed Sep. 24, 2007, Kawano.
U.S. Appl. No. 11/969,606, filed Jan. 4, 2008, Kawano.

* cited by examiner

*Primary Examiner*—Luan C Thai
(74) *Attorney, Agent, or Firm*—Oblon, Spivak, McClelland, Maier & Neustadt, P.C.

(57) ABSTRACT

An interposer is constructed with a substrate body having first and second through-holes, a capacitor formed by a laminating dielectric layer and a second electrode portion on a first electrode portion, which is structured on inner surfaces of first and second through-holes and on the first surface of the substrate body. An insulation layer is formed by filling insulation material in the space within the first through-hole surrounded by second electrode portion, and a first post passes through the insulation layer, one end being electrically connected to the first electrode portion, while the first post is electrically insulated from the second electrode portion. Furthermore, a second post is formed in the second through-hole, and is connected to the second electrode portion at its peripheral surface while being electrically insulated from the first electrode portion.

22 Claims, 12 Drawing Sheets

(11)

(12)

(13)

(14)

(15)

INTERPOSER

CROSS REFERENCE TO RELATED APPLICATIONS

This application claims the benefit of U.S. Provisional Application Ser. No. 60/910,970, filed Apr. 10, 2007, the entire content of which is incorporated herein by reference.

BACKGROUND OF THE INVENTION

1. Field of the Invention

The present invention is related to an interposer, more specifically, to an interposer on which electronic components such as an IC chip are mountable.

2. Description of the Related Art

Japanese Patent Laid-Open Publication 2001-326305 discloses an interposer with a capacitor formed as follows: through-holes are formed in an insulator; a first electrode portion structured on both upper and lower surfaces of the insulator is electrically connected by means of a conductor formed on the inner wall of the through-hole; and a dielectric layer and a second electrode portion are further laminated in this order on the first electrode portion. The entire content of the 326305 application is incorporated herein by reference.

SUMMARY OF THE INVENTION

According to an embodiment of the present invention, an interposer on which electronic devices are mountable includes a substrate body having first and second through-holes that pass through from a first surface to a second surface of the substrate body, and a capacitor formed by laminating a dielectric layer and a second electrode portion on a first electrode portion, the capacitor is formed in at least a partial area of an inner surface of the first through-hole, an inner surface of the second through-hole, and the first surface of the substrate body. An insulation layer is formed by filling insulation material in a space within the first through-hole surrounded by the second electrode portion, and a first post passes through the insulation layer, one end of the first post being electrically connected to the first electrode portion, while the first post is electrically insulated from the second electrode portion via the insulation layer. Also included is a first pad, which is formed on the second surface of the substrate body and is electrically connected to one end of the first post, while being electrically insulated from the second electrode portion, and a second pad, which is formed on the first surface of the substrate body and is electrically connected to the other end of the first post, while being electrically insulated from the second electrode portion. A second post, which fills in a space within the second through-hole, is surrounded by the second electrode portion and is electrically connected to the second electrode portion by contacting the second electrode portion at the peripheral surface, while being electrically insulated from the first electrode portion. A third pad, which is formed on the second surface of the substrate body, and is electrically connected to one end of the second post, while being electrically insulated from the first electrode portion, and a fourth pad, which is formed on the first surface of the substrate body, is electrically connected to the other end of the second post, while being electrically insulated from the first electrode portion.

According to another embodiment of the present invention, an interposer on which electronic devices are mountable includes a substrate body having first and second through-holes that pass through from a first surface to a second surface of the substrate body, and a capacitor formed by laminating a dielectric layer and a second electrode portion on a first electrode portion, the capacitor is formed in at least a partial area of an inner surface of first through-hole, an inner surface of the second through-hole, and the first surface of the substrate body. An insulation layer is formed by filling insulation material in spaces within the first through-hole and the second through-hole surrounded by the second electrode portion, and a first post passes through the insulation layer in the first through-hole, one end of the first post being electrically connected to the first electrode portion, while the first post is electrically insulated from the second electrode portion via the insulation layer. Also included is a first pad, which is formed on the second surface of the substrate body and is electrically connected to the other end of the first post while being electrically insulated from the second electrode portion, a second pad, which is formed on the first surface of the substrate body and is electrically connected to the other end of the first post while being electrically insulated from the second electrode portion, and a second post, one end of which is electrically connected to an area of the second electrode portion located on the first surface of the substrate body. A third pad is formed on an area of the second surface of the substrate body facing the second through-hole, and is electrically connected to the second electrode portion while being electrically insulated from the first electrode portion, and a fourth pad, which is formed on the first surface of the substrate body and is electrically connected to the other end of the second post while being electrically insulated from the first electrode portion.

According to yet another embodiment of the present invention, an interposer on which electronic devices are mountable includes a substrate body having first and second through-holes that pass through from a first surface to a second surface of the substrate body, and a capacitor formed by laminating a dielectric layer and a second electrode portion on a first electrode portion, the capacitor is formed in at least a partial area of an inner surface of the first through-hole, an inner surface of the second through-hole, and the first surface of the substrate body. An insulation layer is formed by filling spaces within the first through-hole and the second through-hole surrounded by the second electrode portion as well as covering the first surface of the substrate, a first post, one end of which is electrically connected to an area of the first electrode portion located on the first surface of the substrate body, and a second post, one end of which is electrically connected to an area of the second electrode portion located on the first surface of the substrate body. A first pad, which is formed on the second surface of the substrate body, facing the first through-hole, is electrically connected to the first electrode portion while being electrically insulated from the second electrode portion, and a second pad, which is formed on the first surface of the substrate body is electrically connected to an area of the first electrode portion located on the first surface of the substrate body while being electrically insulated from the second electrode portion. A third pad is formed on an area of the second surface of the substrate body facing the second through-hole, and is electrically connected to the second electrode portion while being electrically insulated from the first electrode portion, and a fourth pad is formed on the first surface of the substrate body and is electrically connected to an area of the second electrode portion located on the first surface of the substrate body while being electrically insulated from the first electrode portion.

In each of the example interposers described above, the capacitor is formed using the interior surfaces of the first and second through-holes (indicating the inner walls and bottom surfaces in this specification), and thus the electrode surface is larger than that of a capacitor that does not use such interior surfaces. Accordingly, the capacitance is expanded in proportion to the extra surface size. Also in these example embodiments, since the first post is electrically connected to the first electrode portion but not in contact with the second electrode portion, the first post and the second electrode portion have a different electrical potential. As a result, inductance is reduced and impedance is decreased accordingly. Consequently, it is possible to effectively remove noise at the capacitor. At that time, the above-described effect of lowered inductance is not disrupted, since there is no space between the second post and the surrounding second electrode portion, which has substantially the same electrical potential as the second post itself.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
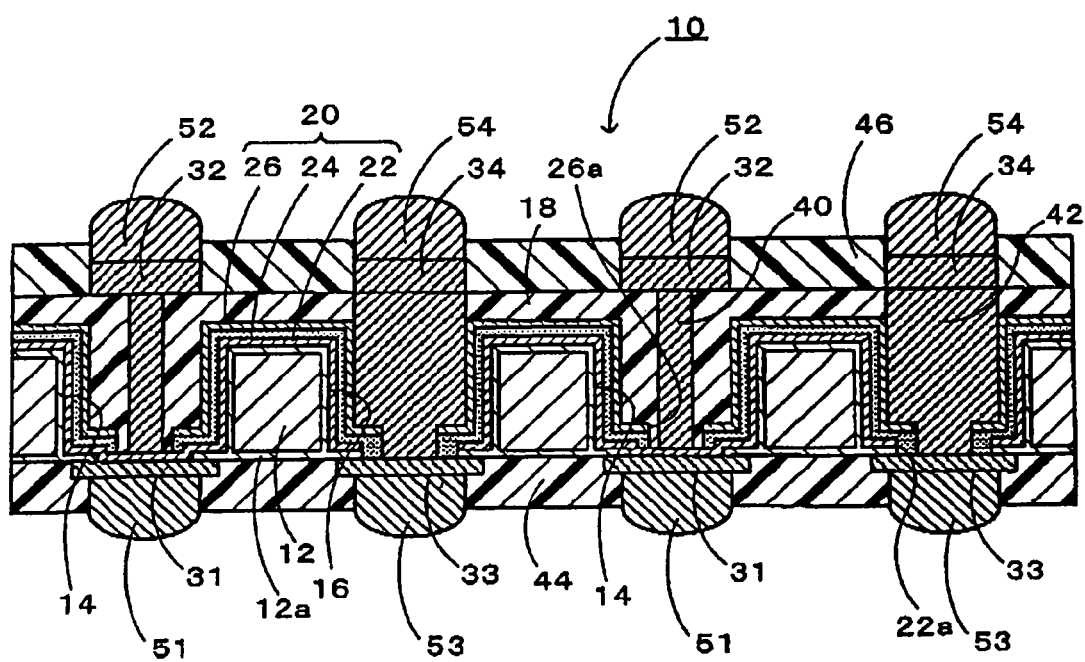
FIG. 1 is a schematic illustration to describe the use of an interposer according to an embodiment of the present invention.
Figure 2:
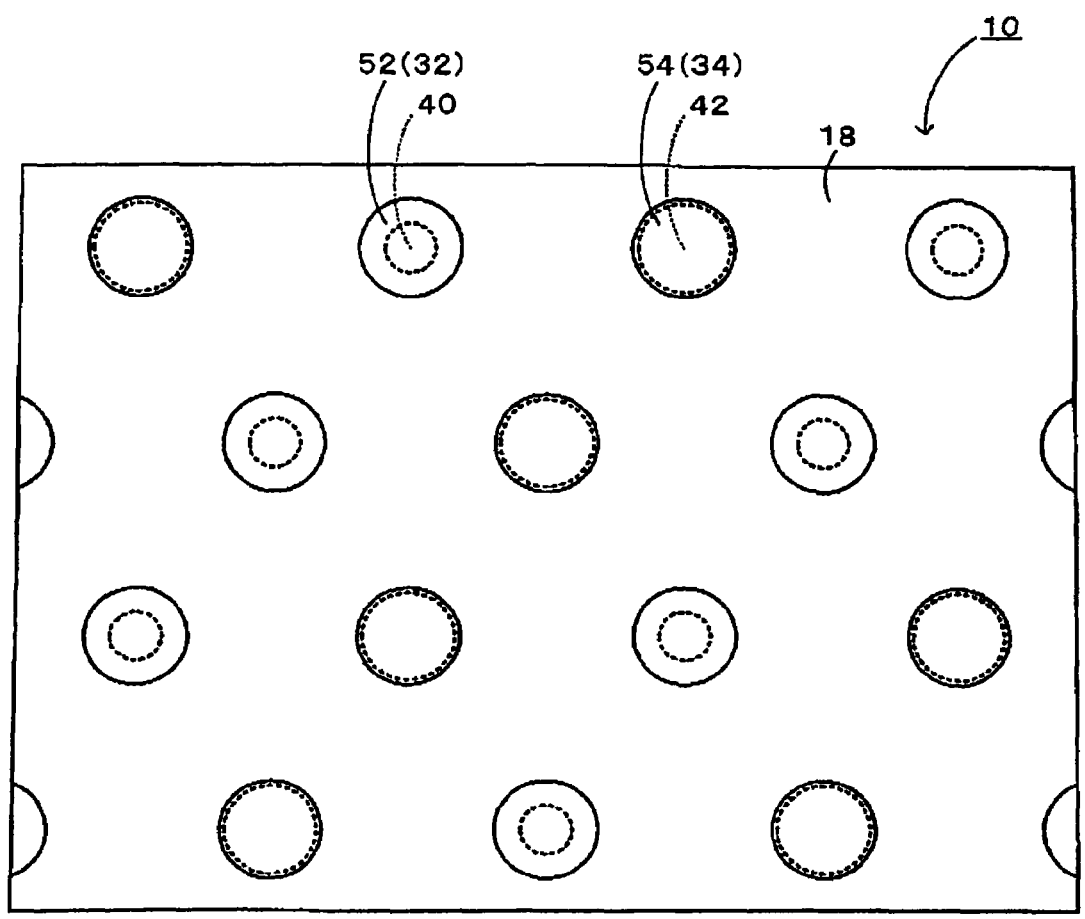
FIG. 2 is a cross-sectional view of a main portion of an interposer according to an embodiment of the present invention.
Figure 3:
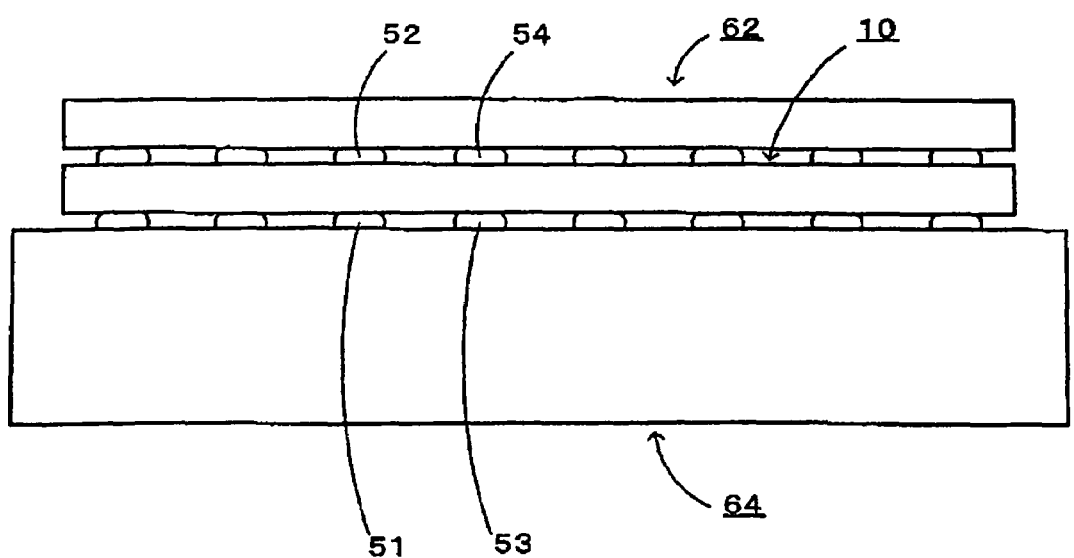
FIG. 3 is a plane view of an interposer according to an embodiment of the present invention.
Figure 4:
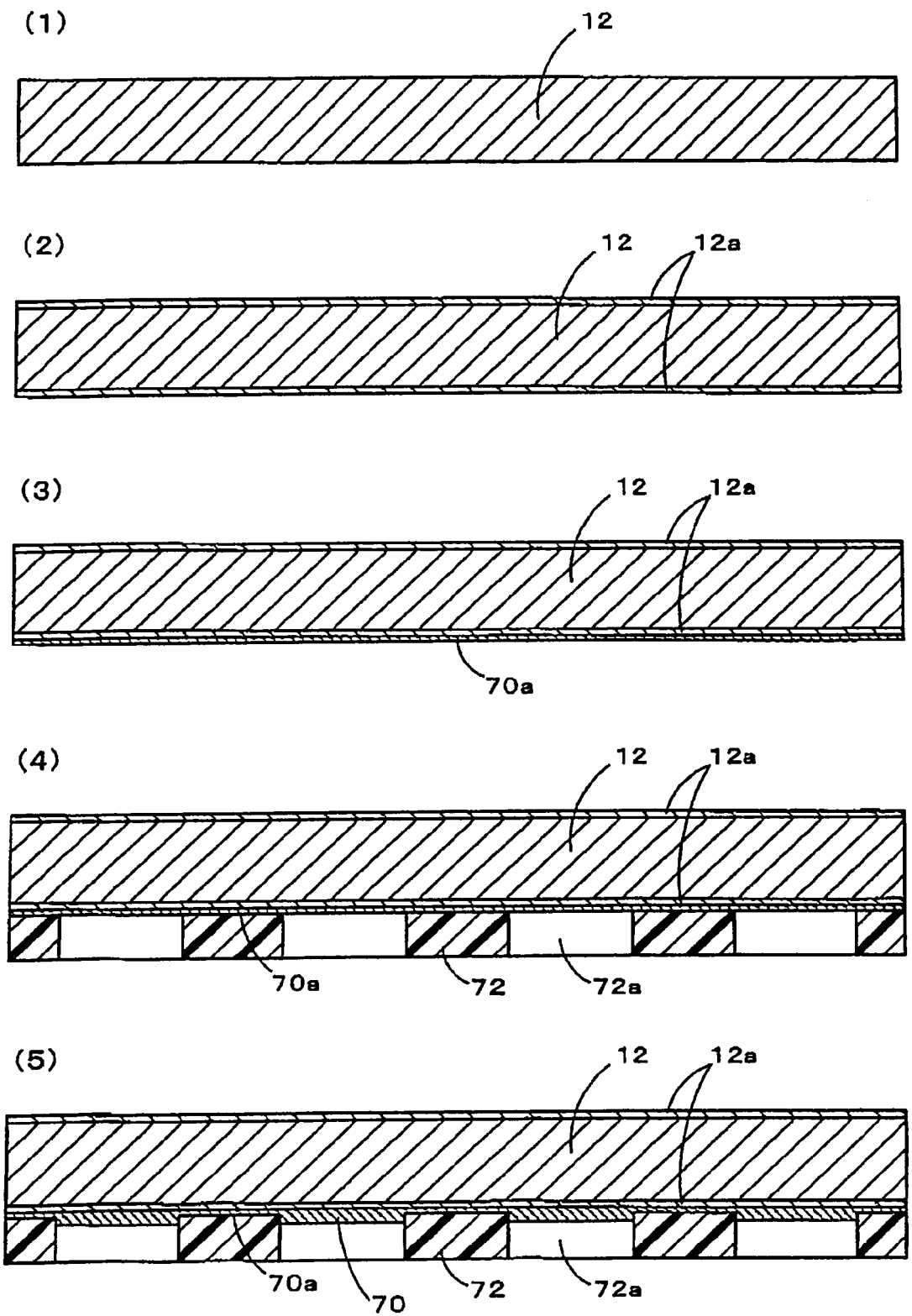
FIG. 4 are illustrations to show production steps of an interposer according to an embodiment of the present invention.

Next, embodiments of the present invention are described with reference to the drawings as follows. FIG. 1 is a cross-sectional view of a main portion of interposer 10 according to one embodiment of the present invention. FIG. 2 is a plane view of interposer 10, and FIG. 3 is a schematic illustration to show how interposer 10 is used. In the description of the present specification, "top," "bottom," "right" and "left," along with other terms, are used. However, such terms are used only to clarify relative positions of the elements. Therefore, "top" and "bottom" may be reversed, as "right" and "left" may also be reversed.

Interposer 10 according to one embodiment of the present invention is constructed with the following: substrate body 12 featuring electric non-conductance; first and second through-holes 14, 16 formed on substrate body 12; capacitor 20, built-in interposer 10; insulation layer 18 which fills the spaces within first through-hole 14 as well as covers the upper surface of substrate body 12; first and third pads 31, 33 formed on the lower surface of interposer 10; and second and fourth pads 32, 34 formed on the upper surface of interposer 10. Here, first pad 31 and second pad 32 are used for connection to a power-source line, and third pad 33 and fourth pad 34 are used for connection to a ground line.

Substrate body 12 is made of an approximately 50/Lm-thick silicon plate with smoothed surfaces. Silicon oxide thin films (12a) are formed by oxidizing the silicon plate on the outer surfaces of substrate body 12. A silicon plate is used, because heat tolerance is required when sputtering or calcining treatments are conducted during the production steps of interposer 10. In place of a silicon plate, glass or polyimide resin with electric non-conductance and heat tolerance may also be used.

First and second through-holes 14, 16 are holes shaped like a cylinder or upside-down truncated cone, which pass vertically through substrate body 12 from the upper surface (first surface) to the bottom (second surface). To form those through-holes, a mask is placed on substrate body 12 and openings are made by an etching procedure, or a mask is used to conduct a drilling process with a laser such as UV, YAG, exima or the like. Inner diameters of these first and second through-holes are approximately 100 μm, and pitches of adjacent through-holes 14, 16 are approximately 200 μm.

Capacitor 20 is constructed with the following: first electrode portion 22, formed in the area including the interior surface of first through-hole 14, the interior surface of second through-hole 16 and the upper surface of substrate body 12; dielectric layer 24 laminated on first electrode portion 22; and second electrode portion 26, further laminated on dielectric layer 24. First electrode portion 22 is a metal thin film with conductivity, and an approximately 0.05 μm-thick platinum thin film is used here. However, copper, aluminum, nickel, silver, gold or the like may be also used. Dielectric layer 24 is a ceramic thin film formed by calcining ceramic-based high-dielectric material at a high temperature. Here, an approximately 0.25/Lm-thick barium titanate ($BaTiO_3$) layer is used, but $SrTiO_3$, $TaO_3$, $Ta_2O_5$, PZT, PLZT, PNZT, PCZT, PSZT, or the like may also be used. Second electrode portion 26 is a metal thin film with conductivity, and approximately 0.3 μm-thick copper thin film is used here. However, aluminum, nickel, silver, gold, platinum, or the like may also be used.

Insulation layer 18 is formed using epoxy resin with electric non-conductance. Insulation layer 18 is formed to cover the upper surface of substrate body 12, but it does not fill the interior space within second through-hole 16 while filling the interior space within first through-hole 14. The portion of insulation layer 18 that fills the interior space within first through-hole 14 is a tube having a center hole which passes vertically through insulation layer 18. First post 40 is formed in the center hole of the tube. Furthermore, the area of insulation layer 18 covering the upper surface of substrate body 12 is formed to be approximately 8 μm thick. Insulation layer 18 may also be formed using other non-conductive resins such as phenol resin, polyimide or the like.

First and third pads 31, 33 are made of copper or nickel and shaped in a disc on the lower surface of interposer 10, but they may be made of other conductive metals or formed in shapes other than a disc. Among them, first pad 31 is electrically connected to first electrode portion 22 of capacitor 20 as well as to one end of first post 40, but does not touch second electrode portion 26. Third pad 33 is electrically connected to second electrode portion 26 of capacitor 20 as well as to one end of second post 42, but does not touch first electrode portion 22. The lower surface of interposer 10 is covered by solder-resist layer 44. First and third pads 31, 33 are electrically connected respectively to first and third bumps 51, 53, which are formed inside the openings formed in solder-resist layer 44.

Second and fourth pads 32, 34 are made of gold/nickel (gold is plated on a nickel surface) and shaped in a disc, but they may be made of other conductive metals and in shapes other than a disc. Second and fourth pads 32, 34 are arranged in a zigzag pattern on the entire surface as shown in FIG. 2, but they may also be arranged in a lattice-like pattern or at random. Second pad 32 is positioned directly over first pad 31 and is electrically connected to first pad 31 by means of first electrode portion 22 of capacitor 20 and first post 40, which passes vertically through insulation layer 18. First post 40 passes vertically through circular hole (26a) without touching its rim. Circular hole (26a) is an opening formed in an area of second electrode 26 that covers the bottom surface of first through-hole 14. Namely, first post 40 is insulated from second electrode portion 26. Fourth pad 34 is positioned directly over third pad 33 and is electrically connected to third pad 33 by means of second electrode portion 26 of capacitor 20 and second post 42, which fills second through-hole 16 without a space. Namely, second post 42 is surrounded by second electrode portion 26, but without a space in between. Also, second post 42 passes vertically through circular hole (22a) without touching its rim. Circular hole (22a) is an opening in an area of first electrode portion 22 that covers the bottom surface of second through-hole 16. Namely, second post 42 is insulated from first electrode portion 22. Furthermore, the upper surface of interposer 10 is covered by solder-resist layer 46. Second and fourth pads 32, 34 are electrically connected respectively to second and fourth bumps 52, 54, which are formed inside the openings in solder-resist layer 46. First and second posts 40, 42 are made of copper, but they may also be made of other conductive metals.

FIGS. 1 and 2 illustrate the center portion of interposer 10 and thus the surrounding environment is not shown. A brief description of the surroundings of interposer 10 is as follows: in the surrounding area of interposer 10, wiring patterns for signal lines are formed on both upper and lower surfaces of substrate body 12; those wiring patterns are appropriately electrically routed by means of through-holes which pass vertically through substrate body 12; and signal pads and signal bumps are formed appropriately in the wiring patterns structured on both upper and lower surfaces of substrate body 12.

Next, a usage example of interposer 10, whose structure is outlined above, is described with reference to FIG. 3. Interposer 10 is mounted on package substrate 64 which has multiple pads arranged on its upper surface. Further, IC chip 62, which has multiple pads arranged on its lower surface, is mounted on interposer 10. In this embodiment, since first and second pads 31, 32 of interposer 10 are used for connection to a power-source line, and third and fourth pads 33, 34 are used for connection to a ground line, power-source terminals and ground terminals of package substrate 64 make contact respectively with first and third bumps 51, 53 of interposer 10. Also, power-source terminals and ground terminals of IC chip 62 make contact respectively with second and fourth bumps 52, 54 of interposer 10. Regarding signal terminals of IC chip 62, not shown in the drawing, and signal bumps of interposer 10, not shown in the drawing, signal terminals of package substrate 64, not shown in the drawing, and signal bumps of interposer 10, not shown in the drawing, such terminals and bumps make contact with each other. Following the above step, each terminal is bonded by reflow. As a result, built-in thin-film capacitor 20 of interposer 10 is positioned between a power-source line, including power-source terminals and the like, and a ground line, including ground terminals and the like. Since capacitor 20 of this embodiment is formed using the inner surfaces of through-holes as well, compared to other capacitors formed using only the upper surface of substrate body 12, its capacitance is expanded in proportion to the extra surface size. Also, inside through-hole 14, first post 40 connected to a power-source line is structured to be surrounded with a space by electrode portion 26, which is connected to a ground line. As a result, second electrode portion 26 and first post 40, positioned adjacent inside through-hole 14, have different electrical potential from each other and thus inductance is decreased and impedance is lowered accordingly. Consequently, the transistor of IC chip 62 seldom experiences a power shortage, and malfunctions resulting from high-frequency noise can be prevented effectively. On the other hand, second post 42 is structured not to have a space between itself and surrounding second electrode portion 26, which is also connected to a ground line as second post 42. Namely, second post 42 and electrode portion 26 are in contact with each other and are integrated into one. Thus, inductance does not increase, unlike in the structure where second electrode portion 26 and second post 42 are formed set apart on the inner surface of second through-hole 16. Therefore, the above-mentioned effect on lowered inductance is not disrupted. Namely, in this embodiment, in first through-hole 14, inductance is designed to decrease, whereas in second through-hole 16, inductance does not decrease but can be controlled not to increase. Therefore, the effect of the inductance factor on power supply to IC chip 62 is suppressed, and malfunctions caused by noise can be prevented. If necessary, a high-capacitance chip capacitor may be mounted around interposer 10 and connected parallel to capacitor 20. Adding a capacitor may make it easier to increase power-supply capacity.

Next, manufacturing steps of interposer 10 are described according to FIGS. 4-10 as follows. First, silicon wafer is prepared for substrate body 12 (see FIG. 4(1)). Silicon-oxide thin film (12a) is formed on both upper and lower surfaces by thermo-oxiding the silicon wafer (see FIG. 4(2)). Then, seed layer (70a) made of copper and nickel is formed by sputtering on the lower surface (see FIG. 4(3)). The formation of silicon-oxide thin film is not limited to a thermo-oxide process, but CVD, PVD or the like may be used. Then, after plating resist 72 is coated on seed layer (70a), circular holes (72a) are formed in the areas which later become first and third pads 31, 33 by photolithographic patterning (see FIG. 4(4)). On the portion of seed layer (70a) exposed through circular hole (72a), copper is laminated by electrolytic copper plating to make bottom metal layer 70, which includes seed layer (70a) (see FIG. 4(5)).

Figure 5:
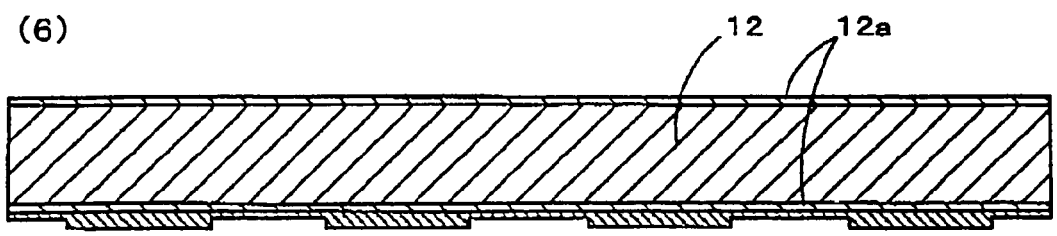
FIG. 5 are illustrations to show production steps of an interposer according to an embodiment of the present invention.
Figure 5:
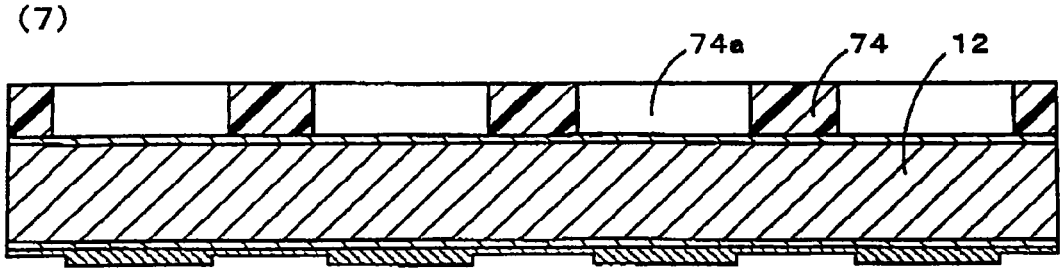
Figure 5:
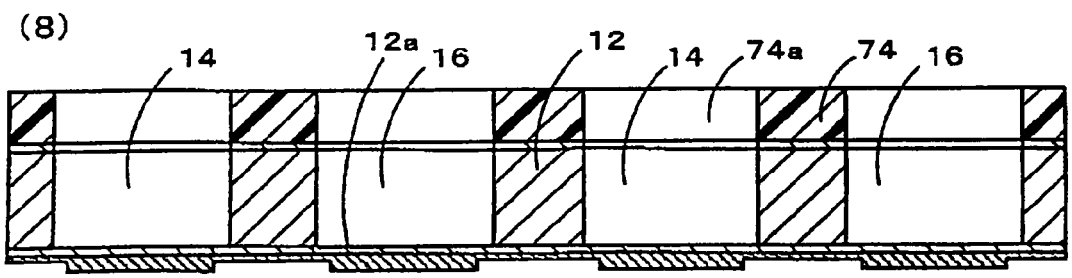
Figure 5:
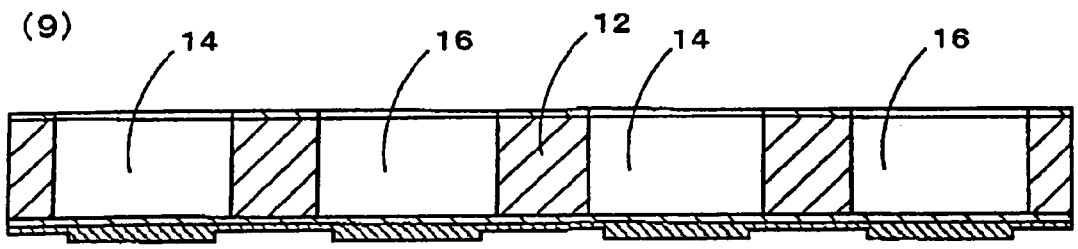
Figure 5:
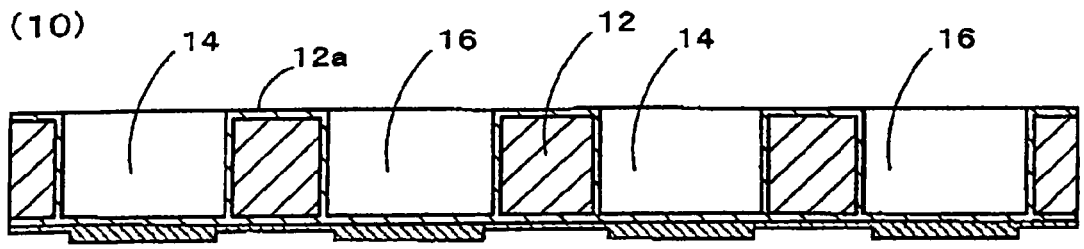

Then, plating resist 72 is exfoliated (see FIG. 5(6)), and etching resist 74 is coated on the upper surface of substrate body 12. Cylindrical holes (74a) are formed in the areas which later become first and second through-holes 14, 16 by photolithographic patterning (see FIG. 5(7)). By applying a dry etching using reactive ion etching (RIE), or wet etching with KOH, first and second through-holes 14, 16 in substrate body 12 are formed (FIG. 5(8)). During this process, thin film (12*a*) functions as an etch-stop layer. Next, etching resist 74 is peeled off (see FIG. 5(9)), and silicon-oxide thin film (12*a*) is also formed on the inner surfaces of first and second through-holes 14, 16 (see FIG. 5(10)). The formation of thin film (12*a*) is not limited to a certain method, but may include CVD, PVD or the like.

Figure 6:
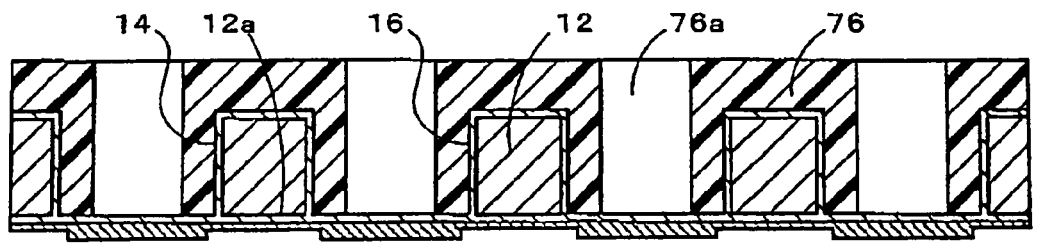
FIG. 6 are illustrations to show production steps of an interposer according to an embodiment of the present invention.
Figure 6:
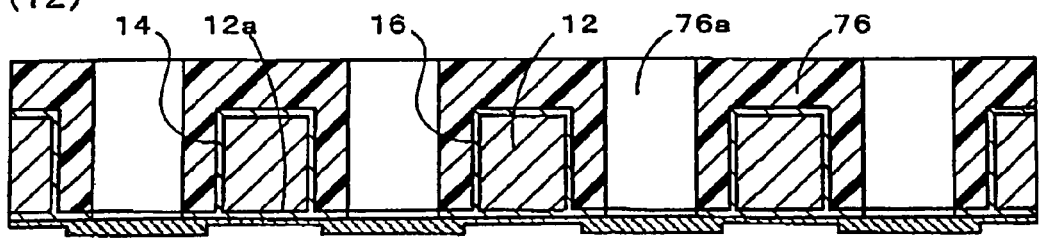
Figure 6:
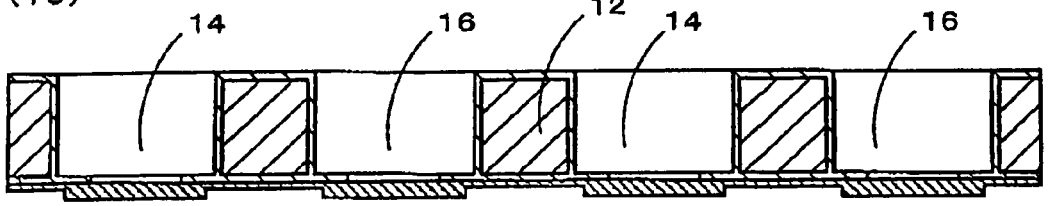
Figure 6:
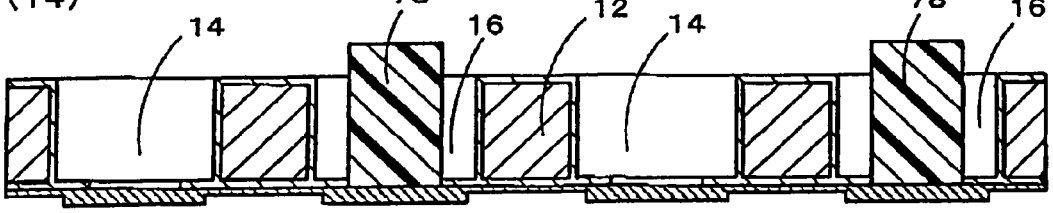
Figure 6:
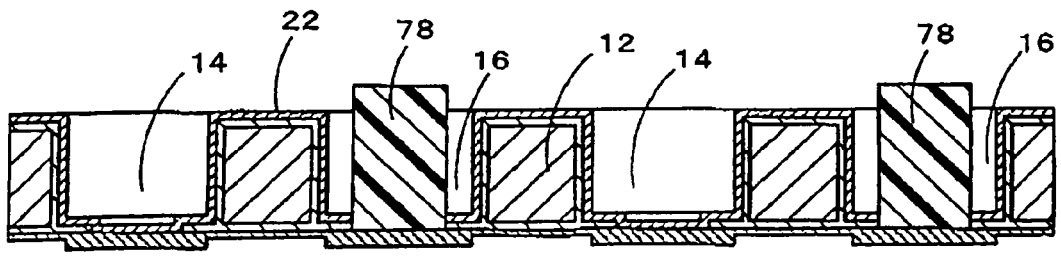

Next, after etching resist 76 is coated on the inner surfaces of first and second through-holes 14, 16 and on the upper surface of substrate body 12, cylindrical portions (76*a*) with a smaller diameter than those of through-holes 14, 16 are formed by lithographic patterning (see FIG. 6(11)). An area of silicon-oxide thin film (12*a*) at the bottom of cylindrical portion (76*a*) is removed by etching (see FIG. 6(12)), and etching resist 76 is exfoliated (see FIG. 6(13)). Then, resist 78 in pillar shape is formed inside second through-hole 16 (see FIG. 6(14)). By sputtering platinum, first electrode portion 22 is formed on the top surface of substrate body 12 and on the inner surface of each through-hole 14, 16 (see FIG. 6(15)).

Figure 7:
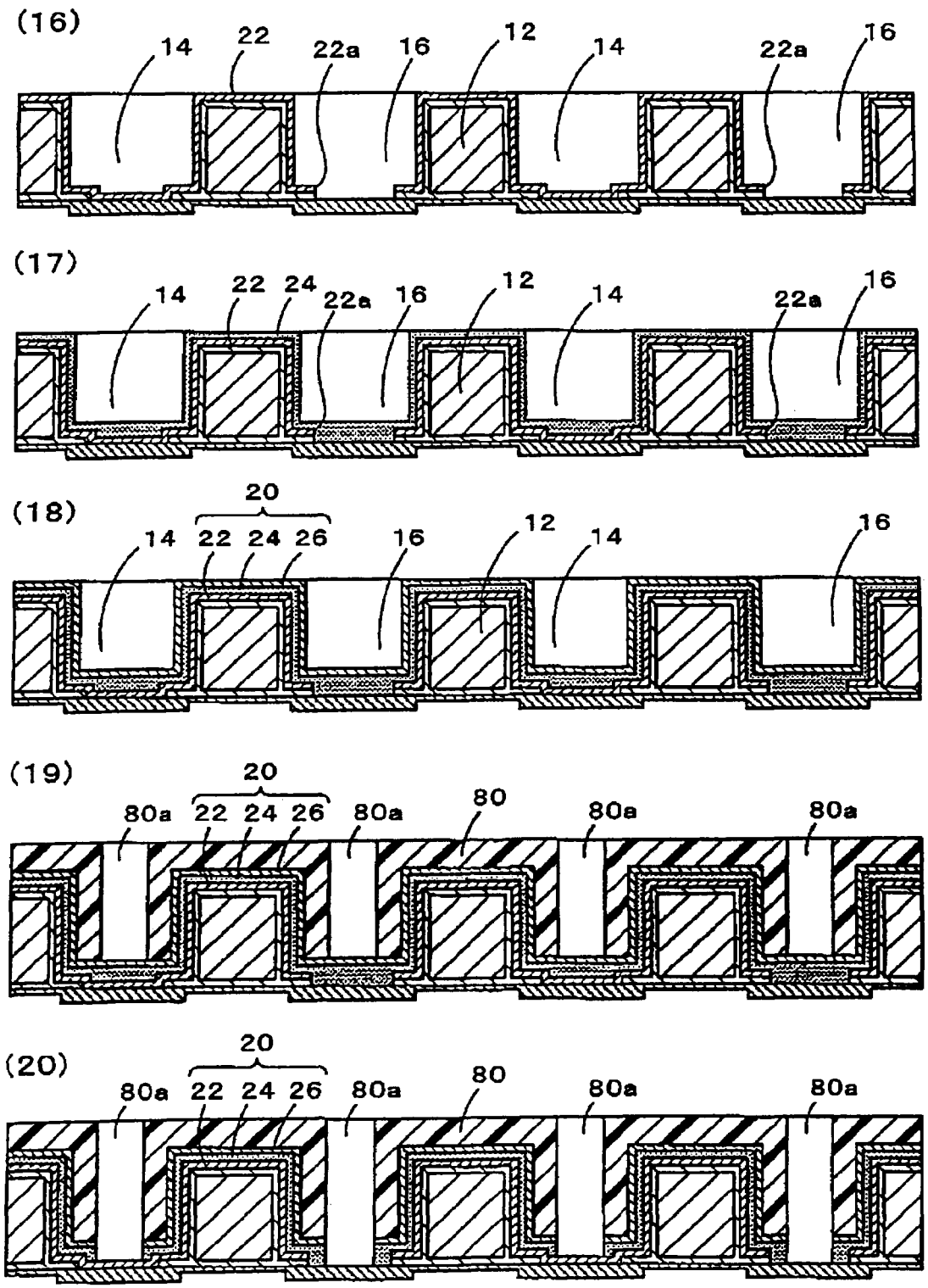
FIG. 7 are illustrations to show production steps of an interposer according to an embodiment of the present invention.

Then, resist 78 is exfoliated (see FIG. 7(16)). As a result, circular hole (22*a*) is formed in the area of first electrode portion 22 at the bottom of second through-hole 16. Next, high-dielectric material such as a sol-gel solution of barium titanium oxide is coated on first electrode portion 22, dried and calcined in an atmosphere with controlled partial pressures of oxygen to form dielectric layer 24 (see FIG. 7(17)). Circular hole (22*a*) is filled with dielectric layer 24. Then, second electrode portion 26 is formed by sputtering copper on dielectric layer 24 (see FIG. 7(18)). Accordingly, capacitor 20 is constructed with first electrode portion 22, dielectric layer 24 and second electrode portion 26. After etching resist 80 is coated on second electrode portion 26, cylindrical hole (80*a*) having the same diameter as first post 40 is formed by photolithographic patterning (see FIG. 7(19)). Using sulfuric acid and hydrogen peroxide, only second electrode portion 26 is etched away from cylindrical hole (80*a*), and then, only dielectric layer 24 is etched away using hydrochloric acid (see FIG. 7(20)).

Figure 8:
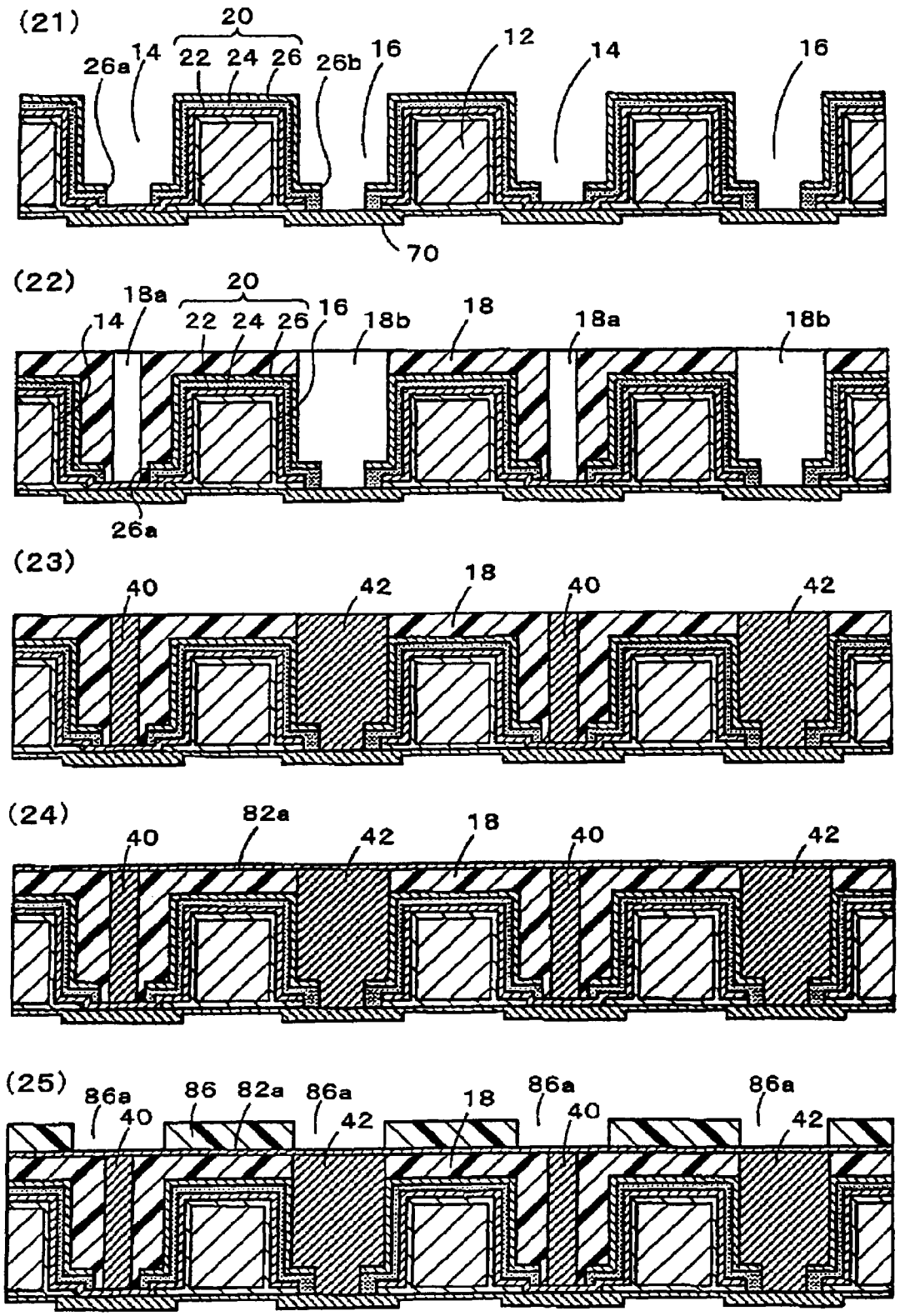
FIG. 8 are illustrations to show production steps of an interposer according to an embodiment of the present invention.

Then, resist 80 is peeled off (see FIG. 8(21)). As a result, circular hole (26*a*) is formed in an area of second electrode portion 26 at the bottom of first through-hole 14, and first electrode portion 22 is exposed to the outside through circular hole (26*a*). Also, circular hole (26*b*) is formed in an area of second electrode portion 26 at the bottom of second through-hole 16, and bottom metal layer 70 covering the lower surface of substrate body 12 is exposed to the outside through circular hole (26*b*). Then, after insulation layer 18 is coated on the upper surface of substrate body 12, cylindrical hole (18*a*) having a smaller diameter than that of circular hole (26*a*) is formed by photolithographic patterning. Cylindrical hole (18*b*) is also formed to expose second electrode portion 26 at the inner surface and bottom surface of second through-hole 16 (see FIG. (22)). Then, by filling each hole (18*a*), (18*b*) with copper to apply a copper plating, first post 40 and second post 42 are formed (see FIG. 8(23)). Next, seed layer (82*a*) is disposed by sputtering nickel on the upper surface of insulation layer 18 (see FIG. 8(24)). After resist 86 is coated on seed layer (82*a*), circular holes (86*a*) are formed on top of first and second posts 40, 42 by photolithographic patterning (see FIG. 8(25)).

Figure 9:
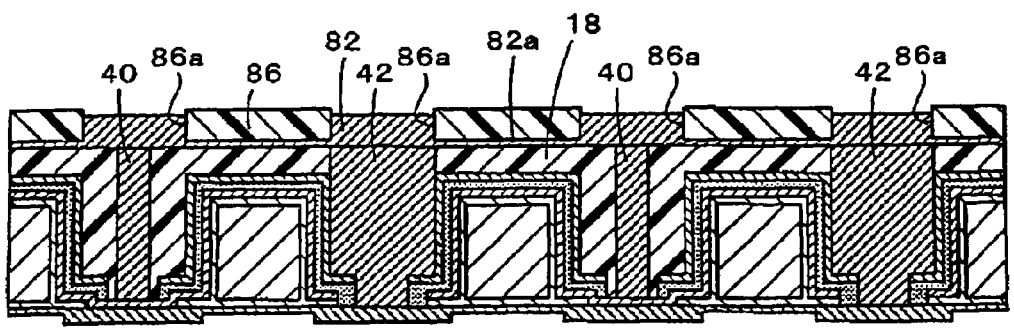
FIG. 9 are illustrations to show production steps of an interposer according to an embodiment of the present invention.
Figure 9:
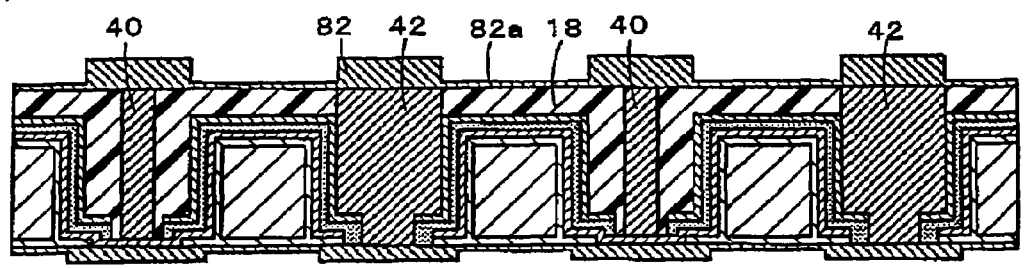
Figure 9:
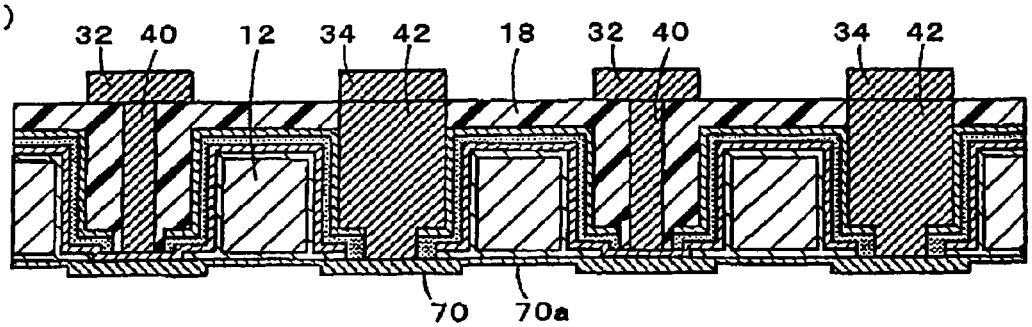
Figure 9:
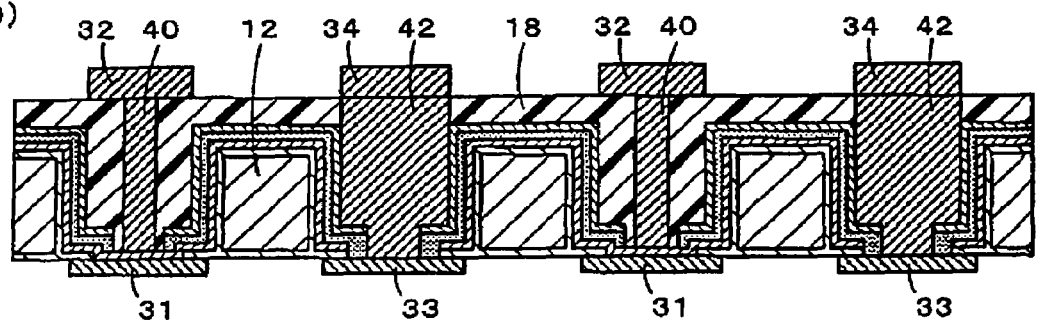
Figure 10:
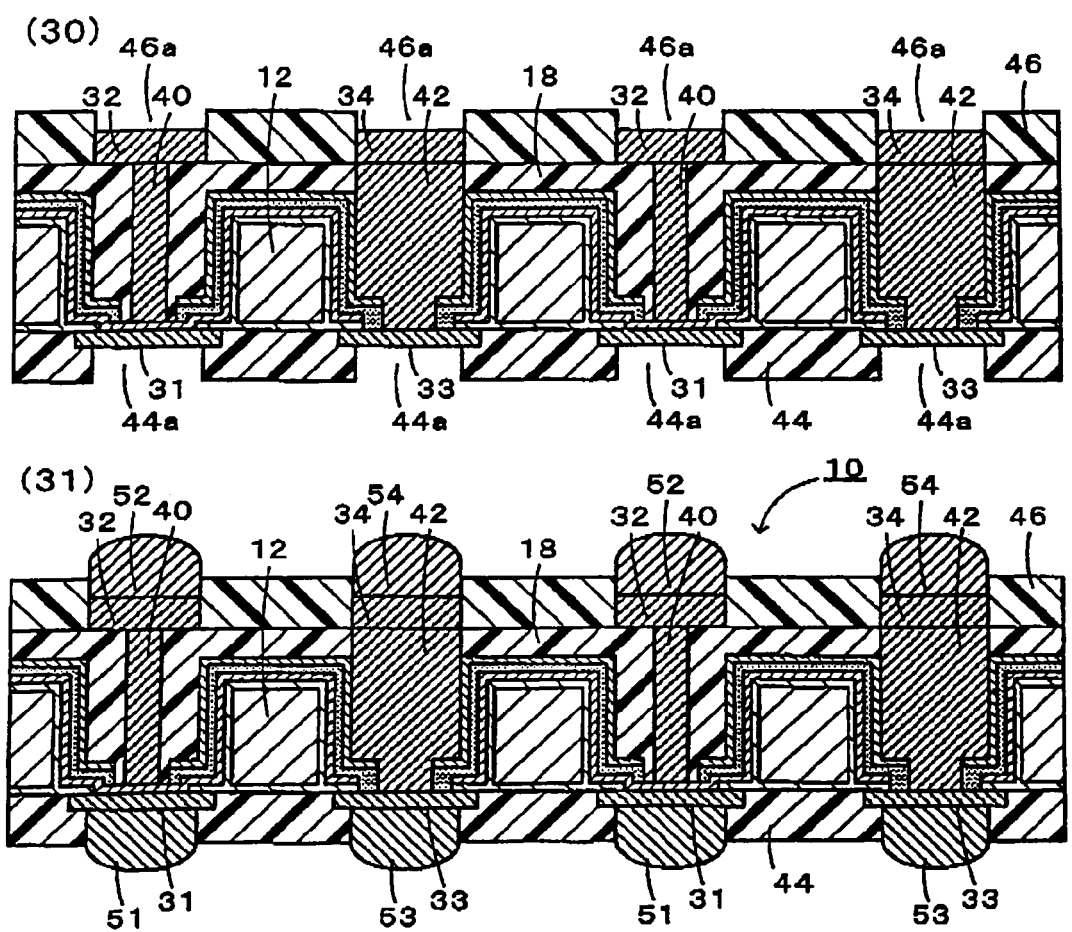
FIG. 10 are illustrations to show production steps of an interposer according to an embodiment of the present invention.

Following the above, by applying nickel plating and gold plating inside circular hole (86*a*), top metal layer 82, which includes seed layer (82*a*), is formed on insulation layer 18 (see FIG. 9(26)), and then resist 86 is exfoliated (see FIG. 9(27)). Next, seed layer (82*a*), which is part of top metal layer 82 and exposed to the outside, is etched away using an acid etchant to form second and fourth pads 32, 34 on insulation layer 18 (see FIG. 9(28)). In a plane view, second and fourth pads 32, 34 look circular. Then, seed layer (70*a*), which is part of bottom metal layer 70 and exposed to the outside, is etched away using sulfuric acid and a hydrogen peroxide solution to form first and third pads 31, 33 on the lower surface of substrate body 12 (see FIG. 9(29)). Same as second and fourth pads 32, 34, first and third pads 31, 33 also look circular in a plane view. After the above, solder-resist is coated on the top and lower surfaces of substrate body 12, and solder-resist layers 44, 46 are formed by patterning. Solder-resist layers 44, 46 have circular holes (44*a*), (46*a*), through which first, second, third and fourth pads 31-34 are exposed to the outside (see FIG. 10(30)). By filling circular holes (44*a*) with a conductive metal, first and third bumps 51, 53 are formed, and by filling circular holes (46*a*) with a conductive metal, second and fourth bumps 52, 54 are formed (see FIG. 10(31)). Finally, interposer 10 of the present embodiment is completed.

According to interposer 10 described above in detail, since electrode portions 22, 26 of capacitor 20 are formed by using inner surfaces of first and second through-holes 14, 16, their surfaces are larger than those formed without using such inner surfaces, and the capacitance is expanded in proportion to the extra surface size. Also, since first post 40 connected to a power-source line is surrounded with a space by second electrode portion 26 connected to a ground line, inductance is lowered and impedance is decreased accordingly. Consequently, the transistor of IC chip 62 seldom experiences a power shortage, and malfunctions resulting from high-frequency noise can be prevented effectively. On the other hand, second post 42 connected to a ground line is structured not to have a space between itself and surrounding second electrode portion 26 connected to a ground line. Thus, the above-mentioned effect on inductance is not disrupted.

The present invention is not limited at all to the above-described embodiments. Needless to say, varieties of embodiments may be applied as long as they are within the technical scope of the present invention.

For example, first and second pads 31, 32 are used for connection to a power-source line, and third and fourth pads 33, 34 are used for connection to a ground line in the above embodiments. However, they may be reversed so that first and second pads 31, 32 are used for connection to a ground line, and third and fourth pads 33, 34 are used for connection to a power-source line. In such an example, the same effect as in the above embodiments can also be expected.

In the above-described embodiments, interposer 10 is mounted between package substrate 64 and IC chip 62. However, interposer 10 may be built in package substrate 64; the same effect as in the above embodiments can be expected. In such an embodiment, a rewiring layer with a fan-out structure is preferred to be formed on the upper surface of interposer 10.

In the above embodiments, first electrode portion 22 of capacitor 20 may be formed on the entire upper surface of substrate body 12, or it may be formed on a partial area of the upper surface. However, considering the potential for expanding the capacitance, it is preferred to be formed on as large an area as possible.

For dielectric layer 24 in capacitor 20 in the above-described embodiment, calcined ceramic material is selected, but an organic resin compound with inorganic filler such as barium titanate or the like may be used. Although the dielectric constant of dielectric layer 24 may not be high enough in capacitor 20 in such an example, the capacitance can be expanded to a certain degree, since the electrode surface is large. Also, components such as resistor and inductor may be added to interposer 10.

Figure 11:
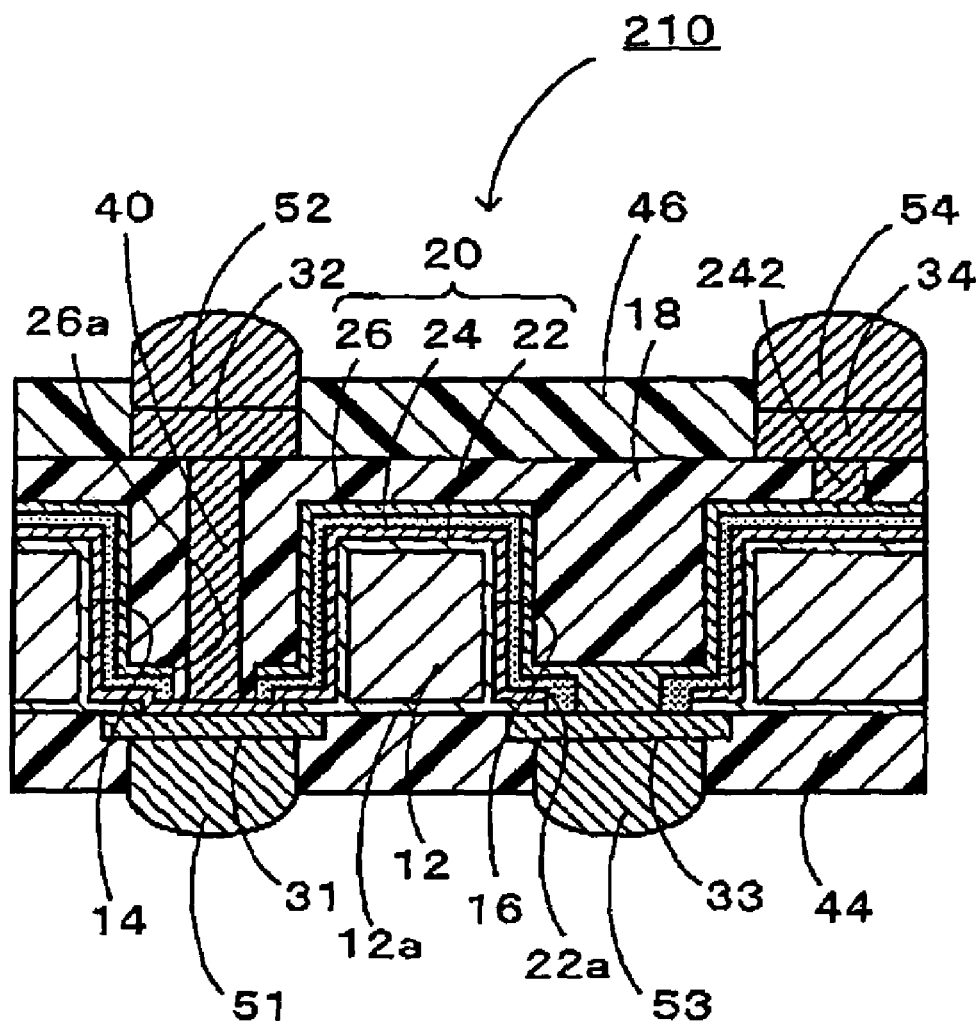
FIG. 11 is a cross-sectional view of a main portion of an interposer according to a second embodiment of the present invention.

In place of the structure described in the above embodiment, interposer 210, whose structure is shown in FIG. 11, may be employed. Regarding interposer 210, the same structure as that of interposer 10 is assigned the same numerical reference and its description is omitted. In interposer 210, capacitor 20 has the same structure as in interposer 10, thus its capacitance is also large as in the above-described embodiment. In interposer 210, fourth pad 34 electrically connected to fourth bump 54 is electrically connected by means of second post 242 to an area of second electrode portion 26 on the upper surface of substrate body 12. On the other hand, first post 40 is electrically connected to first electrode portion 22, but isolated from second electrode portion 26. Thus, the electrical potential of first post 40 is different from that of second electrode portion 26, which surrounds first post 40 with a space in between. Accordingly, inductance is lowered. As a result, impedance is decreased and noise can be effectively removed at capacitor 20. Since second post 242 in FIG. 11 is shorter than second post 42 in FIG. 1, inductance is further decreased, and noise can be removed far more effectively.

Figure 12:
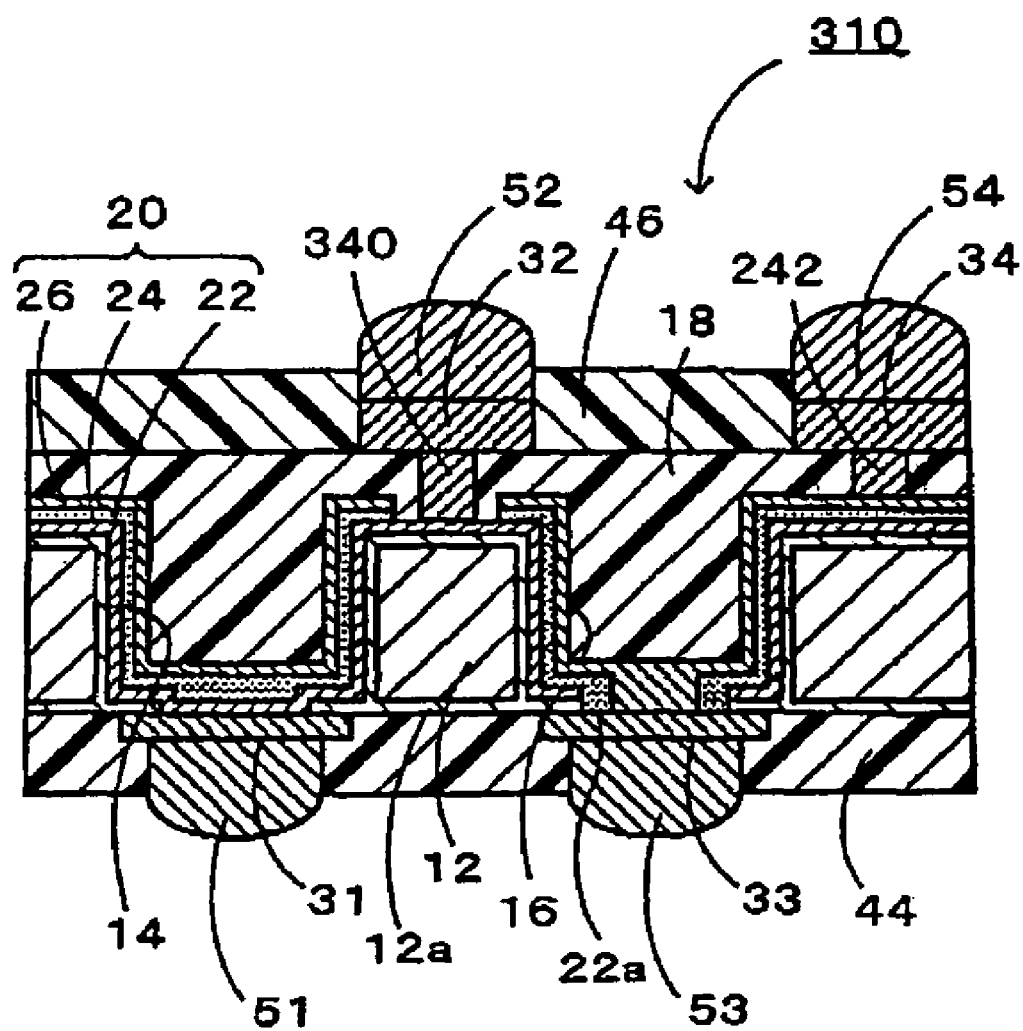
FIG. 12 is a cross-sectional view of a main portion of an interposer according to a third embodiment of the present invention.

Interposer 310 in FIG. 12 is structured the same as interposer 210 in FIG. 11, except second pad 32 electrically connected to second bump 52 is also electrically connected by means of first post 340 to an area of first electrode portion 22 on the upper surface of substrate body 12. Therefore, the same structure as that of interposer 210 is assigned the same numerical reference and its description is omitted. In this example, since capacitor 20 also uses inner surfaces of first and second through-holes 14, 16, its capacitance is large. Also, since first and second posts 340, 242 are short, inductance is decreased. Accordingly, noise can be effectively removed.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

What is claimed is:

1. An interposer comprising:
   a substrate body having first and second through-holes that pass through from a first surface to a second surface of the substrate body;
   a capacitor formed by laminating a dielectric layer and a second electrode portion on a first electrode portion, said capacitor is formed in at least a partial area of an inner surface of the first through-hole, an inner surface of the second through-hole, and the first surface of the substrate body;
   an insulation layer formed by filling insulation material in a space within the first through-hole surrounded by the second electrode portion;
   a first post which passes through the insulation layer in the first through-hole, one end of the first post being electrically connected to the first electrode portion, the first post being electrically insulated from the second electrode portion via the insulation layer; and
   a second post, which fills in a space within the second through-hole, is surrounded by the second electrode portion and is electrically connected to the second electrode portion by contacting the second electrode portion at the peripheral surface, the second post being electrically insulated from the first electrode portion.

2. The interposer according to claim 1, further comprising:
   a first pad, which is formed on the second surface of the substrate body and is electrically connected to one end of the first post, the first pad being electrically insulated from the second electrode portion;
   a second pad, which is formed on the first surface of the substrate body and is electrically connected to the other end of the first post, the second pad being electrically insulated from the second electrode portion;
   a third pad, which is formed on the second surface of the substrate body and is electrically connected to one end of the second post, the third pad being electrically insulated from the first electrode portion; and
   a fourth pad, which is formed on the first surface of the substrate body and is electrically connected to the other end of the second post, the fourth pad being electrically insulated from the first electrode portion.

3. The interposer according to claim 2, wherein the second pad is formed directly over the first pad, and the third pad is formed directly over the fourth pad.

4. The interposer according to claim 1, wherein the substrate body comprises silicon.

5. The interposer according to claim 4, further comprising an insulation film formed between the substrate body and the first electrode portion.

6. The interposer according to claim 1, wherein the dielectric layer comprises ceramic high-dielectric material.

7. The interposer according to claim 1, further comprising at least one of an inductor or a resistor formed at least on the first surface of the substrate body.

8. The interposer according to claim 2, wherein the second pad and second post are made of the same kind of metal.

9. An interposer comprising:
   a substrate body having first and second through-holes that pass through from a first surface to a second surface of the substrate body;
   a capacitor formed by laminating a dielectric layer and a second electrode portion on a first electrode portion, said capacitor is formed in at least a partial area of an inner surface of first through-hole, an inner surface of the second through-hole, and the first surface of the substrate body;
   an insulation layer formed by filling insulation material in spaces within the first through-hole and the second through-hole surrounded by the second electrode portion;
   a first post, which passes through the insulation layer in the first through-hole, one end of the first post being electrically connected to the first electrode portion, the first post being electrically insulated from the second electrode portion via the insulation layer; and
   a second post, one end of which is electrically connected to an area of the second electrode portion located on the first surface of the substrate body.

10. The interposer according to claim 9, further comprising:
    a first pad, which is formed on the second surface of the substrate body and is electrically connected to the other end of the first post, the first pad being electrically insulated from the second electrode portion;
    a second pad, which is formed on the first surface of the substrate body and is electrically connected to the other end of the first post, the second pad being electrically insulated from the second electrode portion;

a third pad, which is formed on an area of the second surface of the substrate body facing the second through-hole, and is electrically connected to the second electrode portion, the third pad being electrically insulated from the first electrode portion; and a fourth pad, which is formed on the first surface of the substrate body and is electrically connected to the other end of the second post, the fourth pad being electrically insulated from the first electrode portion.

11. The interposer according to claim 9, wherein the substrate body comprises silicon.

12. The interposer according to claim 11, further comprising an insulation film formed between the substrate body and the first electrode portion.

13. The interposer according to claim 9, wherein the dielectric layer comprises ceramic high-dielectric material.

14. The interposer according to claim 9, further comprising at least one of an inductor or a resistor formed at least on the first surface of the substrate body.

15. The interposer according to claim 10, wherein the second pad and second post are made of the same kind of metal.

16. An interposer comprising:

a substrate body having first and second through-holes that pass through from a first surface to a second surface of the substrate body;

a capacitor formed by laminating a dielectric layer and a second electrode portion on a first electrode portion, said capacitor is formed in at least a partial area of an inner surface of the first through-hole, an inner surface of the second through-hole, and the first surface of the substrate body;

an insulation layer formed by filling spaces within the first through-hole and the second through-hole surrounded by the second electrode portion as well as covering the first surface of the substrate;

a first post, one end of which is electrically connected to an area of the first electrode portion located on the first surface of the substrate body; and a second post, one end of which is electrically connected to an area of the second electrode portion located on the first surface of the substrate body.

17. The interposer according to claim 16, further comprising:

a first pad, which is formed on the second surface of the substrate body, facing the first through-hole, and is electrically connected to the first electrode portion, the first pad being electrically insulated from the second electrode portion;

a second pad, which is formed on the first surface of the substrate body and is electrically connected to an area of the first electrode portion located on the first surface of the substrate body, the second pad being electrically insulated from the second electrode portion;

a third pad, which is formed on an area of the second surface of the substrate body facing the second through-hole, and is electrically connected to the second electrode portion, the third pad being electrically insulated from the first electrode portion; and a fourth pad, which is formed on the first surface of the substrate body and is electrically connected to an area of the second electrode portion located on the first surface of the substrate body, the fourth pad being electrically insulated from the first electrode portion.

18. The interposer according to claim 16, wherein the substrate body comprises silicon.

19. The interposer according to claim 18, further comprising an insulation film formed between the substrate body and the first electrode portion.

20. The interposer according to claim 16, wherein the dielectric layer comprises high-dielectric material.

21. The interposer according to claim 16, further comprising at least one of an inductor or a resistor formed at least on the first surface of substrate body.

22. The interposer according to claim 17, wherein the second pad and second post are made of the same kind of metal.

* * * * *